(12) United States Patent
Lui et al.

(10) Patent No.: US 8,008,716 B2
(45) Date of Patent: Aug. 30, 2011

(54) INVERTED-TRENCH GROUNDED-SOURCE FET STRUCTURE WITH TRENCHED SOURCE BODY SHORT ELECTRODE

(75) Inventors: Sik K Lui, Sunnyvale, CA (US); François Hébert, San Mateo, CA (US); Anup Bhalla, Santa Clara, CA (US)

(73) Assignee: Alpha & Omega Semiconductor, Ltd (BM)

( * ) Notice: Subject to any disclaimer, the term of this patent is extended or adjusted under 35 U.S.C. 154(b) by 614 days.

(21) Appl. No.: 11/522,669

(22) Filed: Sep. 17, 2006

(65) Prior Publication Data

US 2008/0067584 A1     Mar. 20, 2008

(51) Int. Cl.
*H01L 29/66*     (2006.01)
(52) U.S. Cl. .................... 257/332; 257/330; 257/E29.26
(58) Field of Classification Search .................. 257/330, 257/331, 332, 341, E29.26, E29.257
See application file for complete search history.

(56) References Cited

U.S. PATENT DOCUMENTS 6,906,380 B1 *   6/2005   Pattanayak et al. ........... 257/331
* cited by examiner

*Primary Examiner* — Kiesha R Bryant
*Assistant Examiner* — Tucker Wright
(74) *Attorney, Agent, or Firm* — Bo-In Lin

(57) ABSTRACT

This invention discloses bottom-source lateral diffusion MOS (BS-LDMOS) device. The device has a source region disposed laterally opposite a drain region near a top surface of a semiconductor substrate supporting a gate thereon between the source region and a drain region. The BS-LDMOS device further has a combined sinker-channel region disposed at a depth in the semiconductor substrate entirely below a body region disposed adjacent to the source region near the top surface wherein the combined sinker-channel region functioning as a buried source-body contact for electrically connecting the body region and the source region to a bottom of the substrate functioning as a source electrode. A drift region is disposed near the top surface under the gate and at a distance away from the source region and extending to and encompassing the drain region. The combined sinker-channel region extending below the drift region and the combined sinker-channel region that has a dopant-conductivity opposite to and compensating the drift region for reducing the source-drain capacitance.

16 Claims, 10 Drawing Sheets

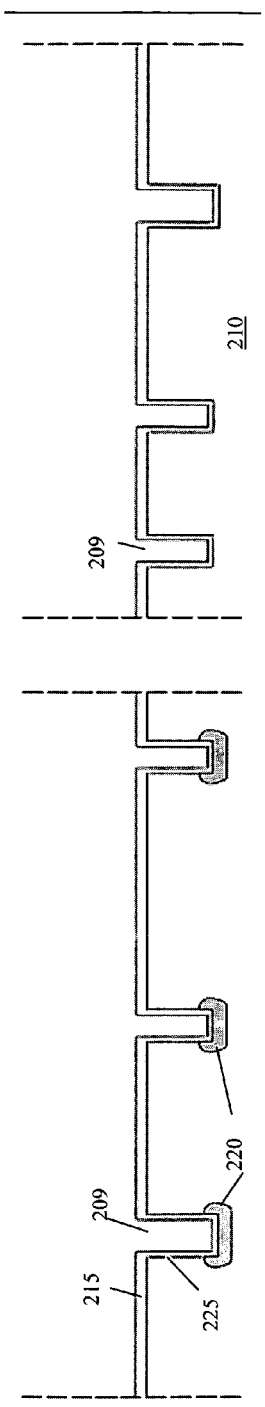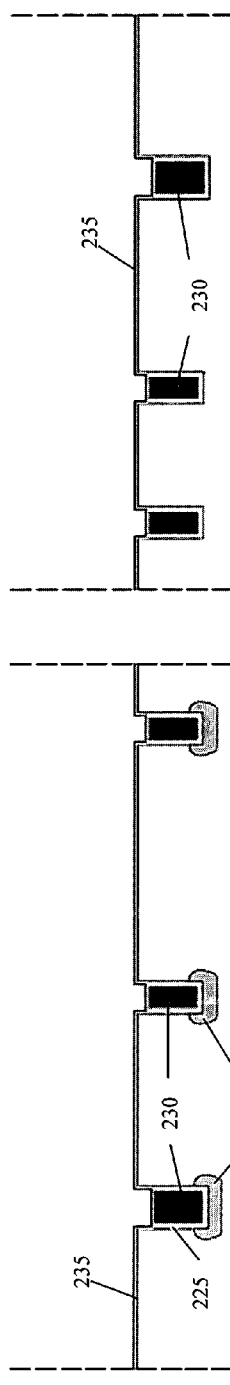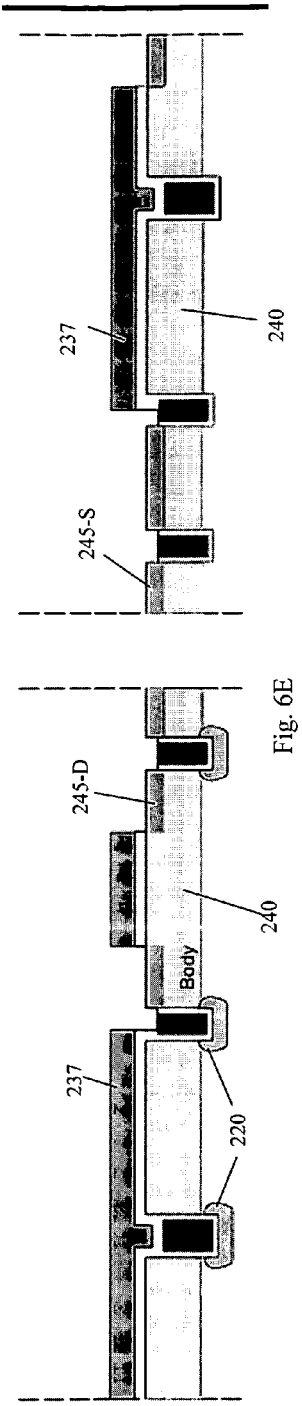

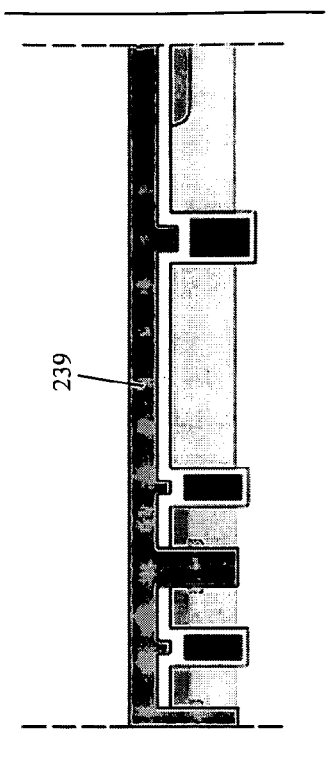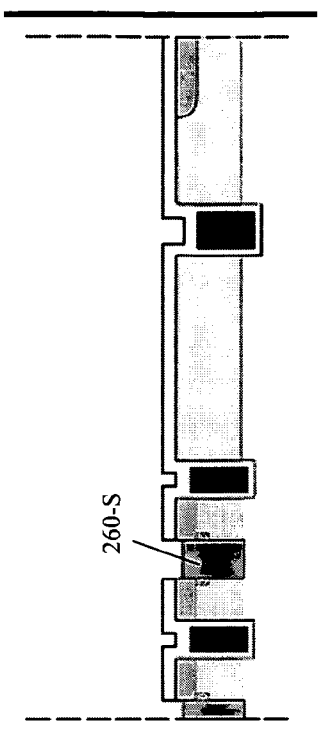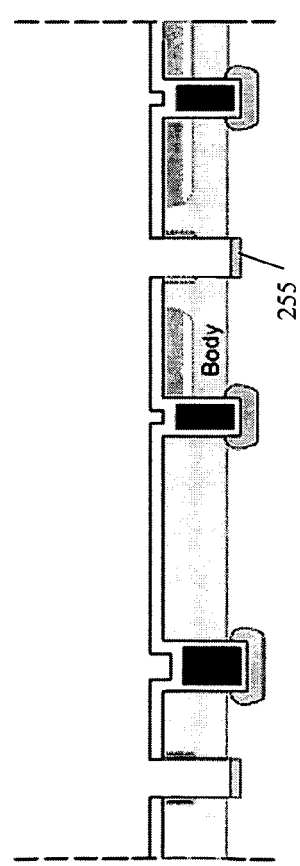
Fig. 6H
Fig. 6I

INVERTED-TRENCH GROUNDED-SOURCE FET STRUCTURE WITH TRENCHED SOURCE BODY SHORT ELECTRODE

BACKGROUND OF THE INVENTION

1. Field of the Invention

The invention relates generally to the semiconductor power devices. More particularly, this invention relates to an inverted-trench grounded source field effect transistor (FET) structure that uses a conductive substrate with trench source body short electrode.

2. Description of the Prior Art

Conventional technologies to further reduce the source inductance for semiconductor MOSFET devices including the source inductance in FET; MOSFET and JFET devices are challenged by several technical difficulties and limitations. Specifically, there are technical challenges faced by those of ordinary skill in the art to reduce the source inductance. Meanwhile, there are ever increasing demand to reduce the source inductance in the semiconductor power devices because more and more power devices are required for applications that demand these devices to function with high efficiency, high gain, and high frequency. Generally, reduction of source inductance can be achieved by eliminating the bond-wires in the package of a semiconductor power device. Many attempts are made to eliminate the bond-wires by configuring the semiconductor substrate as a source electrode for connection of the semiconductor power devices. There are difficulties in such approaches due to the facts that typical vertical semiconductor power devices is arranged to place the drain electrode on the substrate. Referring to FIGS. 1A and 1B for the vertical power devices shown as trenched and planar DMOS devices respectively that uses the substrate as the drain electrode with the current flows vertically from the source down to the drain region disposed at the bottom of the substrate. The top source electrode usually requires bond wires for electrical connections during a device packaging process thus increasing the source inductance.

Referring to FIG. 1C for a new vertical channel LDMOS device disclosed by Seung-Chul Lee et al, in Physica Cripta T101, pp. 58-60, 2002, with a structure shown as a standard vertical trenched DMOS wherein the drain contact is disposed on the side while the source is still on top of the active area. However, this device has a limitation due to a large cell pitch caused by the lateral spacing required by the top drain contact. In addition to the limitation of large cell pitch, the trenched FET device in general has a fabrication cost issue due to the fact that the trenched FET requires technologies that may not be available in all foundries and that tend to drive up the fabrication costs. For this reason, it is also desirable to implement the power device as lateral device with planar gate.

Several lateral DMOS with grounded substrate source have been disclosed. A lateral DMOS device typically includes a P+ sinker region (or alternate a trench) to connect the top source to the P+ substrate. The sinker region or the trench increases the pitch of the cell due to the dimensions occupied by the sinker or the trench. Referring to FIG. 1D for a device cross section disclosed by G. Cao et. al, in "Comparative Study of Drift Region Designs in RF LDMOSFETs", IEEE Electron Devices, August 2004, pp 1296-1303. Ishiwaka O et al; disclose in "A 2.45 GHz power Ld-MOFSET with reduced source inductance by V-groove connections", International Electron Devices Meeting. Technical Digest, Washington, D.C., USA, 1-4 Dec. 1985, pp. 166-169. In U.S. Pat. No. 6,372,557 by Leong (Apr. 16, 2002) attempts are made to use a buried layer at the interface of the P+ and P-epi layers to reduce the lateral diffusion and hence reduce pitch. In U.S. Pat. No. 5,821,144 (D'Anna and Hebert, Oct. 13, 1998) and U.S. Pat. No. 5,869,875, Hebert "Lateral Diffused MOS transistor with trench source contact" (issued on Feb. 9, 1999) devices are disclosed to reduce the cell pitch by placing the source sinker or trench on the OUTER periphery of the structure. However, in these disclosures, most of the devices as shown use the same metal over the source/body contact regions and gate shield regions and some of the devices use a second metal for drain and gate shield regions. These configurations generally has large cell pitch due to the lateral diffusions that increases the drift length over the horizontal plane. A large cell pitch causes a large on-resistance that is a function of resistance and device areas. A large cell pitch also increases the device costs due to a larger size of the device and a larger size package.

Therefore, a need still exists in the art of power semiconductor device design and manufacture to provide new device configurations and manufacturing method in forming the power devices such that the above discussed problems and limitations can be resolved.

SUMMARY OF THE PRESENT INVENTION

It is therefore an aspect of the present invention to provide a new and improved inverted ground-source trenched FET on highly doped substrate, e.g., highly doped N+ substrate, with a bottom-source and top-drain having a reduced cell pitch by using a trench body/source short structure without a P+ sinker thus achieving low manufacturing cost. The low manufacturing cost is achieved because a low effective die cost with a reduce cell pitch when the improved device configuration is implemented. The above discussed technical difficulties and limitations of not able to shrink the cell pitch as encountered in the conventional semiconductor power devices are therefore overcome.

Specifically, it is an aspect of the present invention to provide a new and improved inverted ground-source trenched FET on highly doped substrate, e.g., highly doped N+ substrate, with a bottom-source and top-drain that has a significant reduce source inductance by eliminating the source wires and meanwhile minimizing the specific on resistance Rsp by using an integrated body-source short structure distributed within the device or using metal interconnect layers.

It is another aspect of the present invention to provide a new and improved inverted ground-source trenched FET on highly doped substrate, e.g., highly doped N+ substrate, with a bottom-source and top-drain that are scalable for compatible with applications over a range of high and low voltages. The semiconductor power devices as disclosed in this invention further achieve rugged and reliable performance with reduced possibility of latch up, reduced hot carrier injection and peak voltage generation away from gate oxide, etc. because of the distributed body contact configurations.

It is another aspect of the present invention to provide a new and improved inverted ground-source trenched FET on highly doped substrate, e.g., highly doped N+ substrate, with a bottom-source and top-drain that are scalable for providing a vertical current channel with controllable drift region length such that it is more adaptable for pitch reduction configurations. The bottom source connection is established through a conductive substrate and a source contact formed at the bottom of the trench in direct contact with the highly doped N+ substrate. The requirement for using a deep resistive sinker or a trench contact is therefore eliminated.

It is another aspect of the present invention to provide a new and improved inverted ground-source trenched FET on highly doped substrate, e.g., highly doped N+ substrate, with a bottom-source and top-drain that an integrated high-side (HS) and low-side (LS) trenched power MOSFET for a buck converter application can be easily configured and integrated on a same semiconductor die. A substrate that serves as source of a HS FET and the drain of a LS FET establishes direct contact between the source of HS FET and the drain of LS FET.

Briefly in a preferred embodiment this invention discloses a semiconductor power device constituting an inverted ground-source trenched FET on highly doped N+ substrate with a bottom-source and top-drain that further includes a plurality of trenches for forming a gate therein. The semiconductor power device further includes a body-source contact distributed within the device as buried conductor for electrically connecting a body region to a source region on the highly doped N+ substrate.

Furthermore, this invention discloses a method of manufacturing an integrated High-side and Low-side trenched MOSFET for a buck converter application includes steps of simultaneously manufacturing an inverted field-effect-transistor (iT-FET) semiconductor device to function as a high-side FET with a Schottky FET device to function as a low-side FET on a same semiconductor substrate by forming a source of the iTFET semiconductor FET on a bottom surface of the substrate for direct electric connection to a drain of the Schottky FET. Furthermore, in a preferred embodiment, the step of simultaneously manufacturing the inverted field-effect-transistor (iT-FET) semiconductor device and the Schottky FET further includes a step of integrating the iT-FET semiconductor device and the Schottky FET on a single die of the semiconductor substrate whereby the buck converter is manufactured as a single chip on the single die without a leadframe These and other objects and advantages of the present invention will no doubt become obvious to those of ordinary skill in the art after having read the following detailed description of the preferred embodiment, which is illustrated in the various drawing figures.

BRIEF DESCRIPTION OF THE DRAWINGS

FIGS. 6A to 6K are a serial cross sectional views to illustrate the fabrication processing steps to manufacture an integrated High-side and Low-side trenched MOSFET for a buck converter application as shown in FIG. 5A.

DETAILED DESCRIPTION OF THE METHOD

Figure 1A:
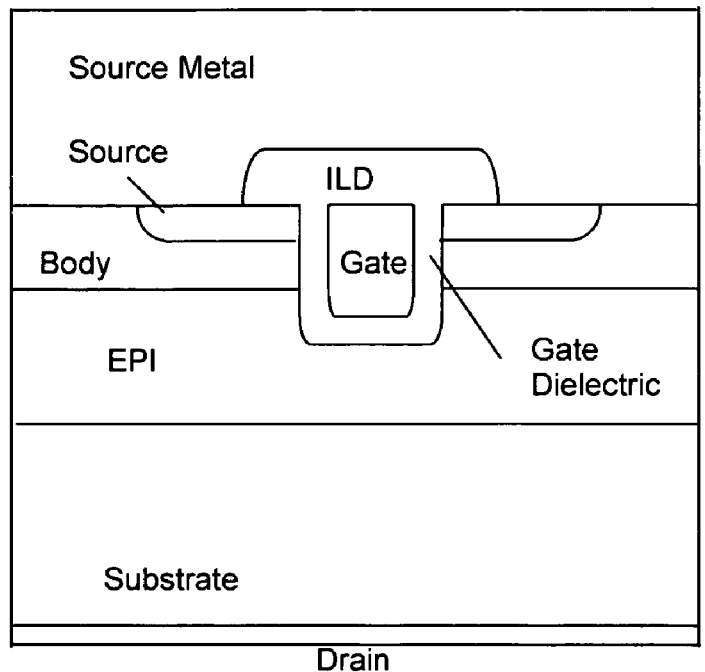
FIGS. 1A and 1B are cross sectional views for showing the typical vertical power device configurations implemented as a trenched-gate and planar-gate vertical power devices respectively.
Figure 1B:
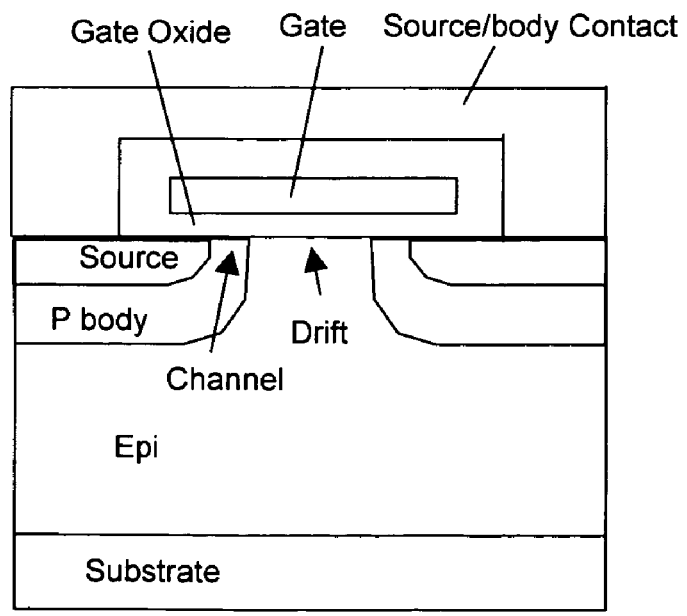
Figure 1C:
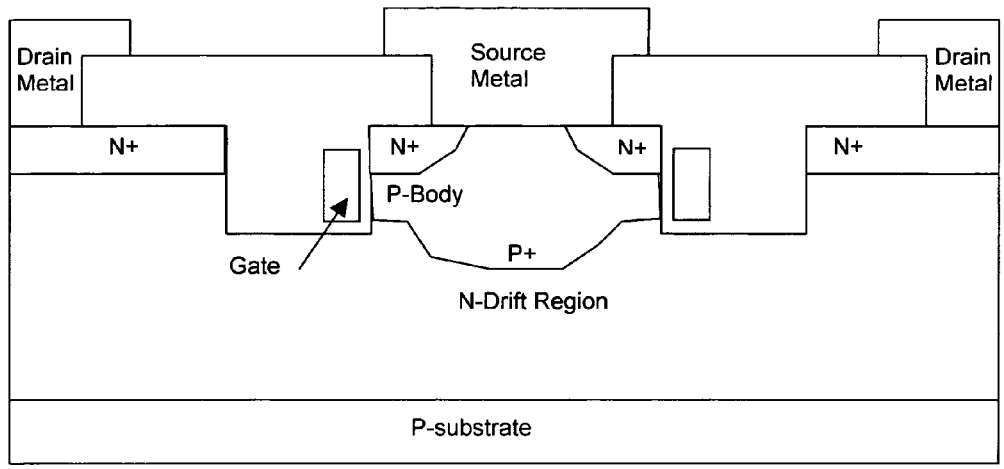
FIG. 1C is a cross sectional view of vertical channel LDMOS device.
Figure 1D:
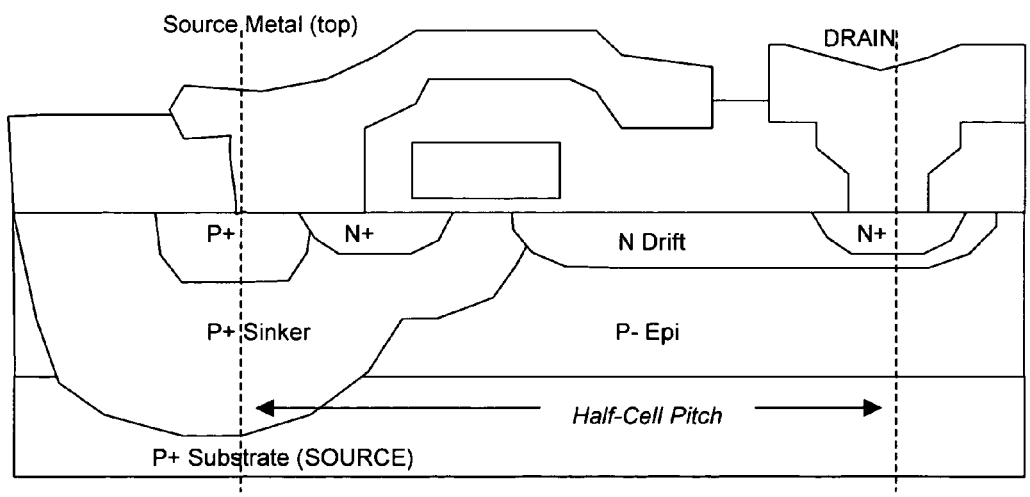
FIG. 1D is a cross sectional view of a drift region designs in a LDMOSFET device for RF application.
Figure 2:
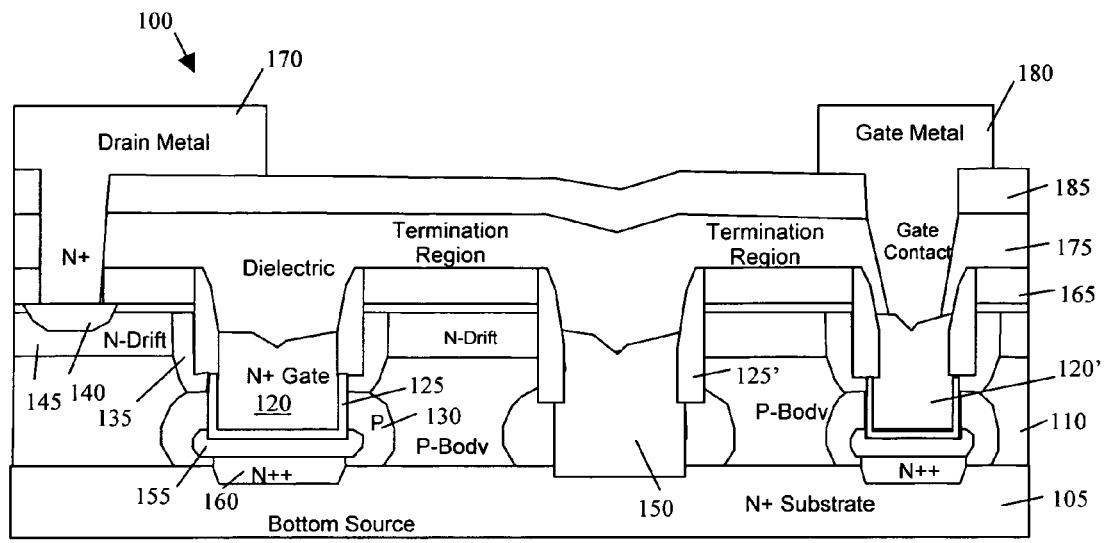
FIG. 2 is a cross sectional view of an inverted ground-source trenched FET device with the bottom source formed on a highly doped N+ bottom layer and using a body-source short structure formed as a buried conductor distributed within the device as an embodiment of this invention.

Referring to FIG. 2 for a cross sectional view of an inverted ground-source trenched FET device with a bottom source and a top drain of this invention. The inverted ground-source trenched FET device is supported on a N+ substrate 105 functioning as a bottom source electrode. A layer of P− epitaxial layer 110 functioning as a P-body region is supported on top of the substrate 105. The substrate is configured with an active cell area and a termination area typically disposed on the peripheral of the substrate. The FET device 100 has a plurality of trenches opened from the top surface of the substrate to reach to a lower portion of the epitaxial layer 110. The trenches opened in the active cell area is filled with gate polysilicon layer to form a gate 120 with the sidewalls of the trenches padded with a trench wall oxide layer 125. The trench in the termination area forms the gate runner 120' with trenched gate 120 extended thereto. An N+ region 160 is disposed under the gate trench extending between N+ substrate and a source region 155 encompassed by a P doped region 130 formed in the epitaxial layer surrounding the trenched gate 120. An N-link region 135 is formed on top of the body region 130 to contact a N-drift region 145 encompassed a N+ drain contact region 140 near the top surface of the substrate. A thicker gate oxide layer 125' is formed on the upper part of the gate sidewalls to insulate the trenched gate 120 from the N-drift region 145 to reduce the gate drain capacitance Cgd. A channel is formed between source region 155 and N-link region 145 by the P region 130. Alternatively the gate trench may reach the N+ substrate without the formation of regions 155 and 160.

The trenched vertical FET device further includes a body-source short structure 150 formed at the bottom of the buried conductor trenches in the active cell area. The body-source short structure 150 is formed with a conductive plug 150, e.g., a silicide of Ti, Co, W plug, surrounded by the P-doped region 155 and N+ substrate (or an optional highly doped N++ region below the conductive plug 150) to form a highly conductive low resistivity body-source short structure. A drain metal covers 170 the active cell area and a gate metal 180 is formed in the termination area. The drain metal and the gate metal are in electrical contact with the drain 140 and the gate runner 120' through a drain contact opening and gate contact opening opened through a passivation layer 185, a dielectric layer 175, e.g., a BPSG layer, and an insulation layer, e.g., an oxide layer 165, covering the top surface of the FET device. The integrated body/source short 150 as shown is buried conductor plugs filing the trenches for forming the body-source short structures that are distributed throughout the device. The N-drift region in this configuration is left unconnected because there is no contact to the termination region. Since the substrate is at the source potential that is ground potential for an NMOS device, the floating N-drift region 145 is likely operates at a ground potential. The device configuration as shown further has an advantage that any damage from the sawing of the dies in the scribing region will tend to short the floating N-drift regions to the grounded substrate. The device structure provides a vertical channel that includes a bottom source with the source connected to the bottom of the substrate. Unlike the conventional bottom source devices, the bottom source devices of this invention are implemented without using a P+ sinker immediately below the source region. Instead, the bottom source device of this invention employs a body/source short structure as the conductive plug 150. Therefore, the device structure of this invention saves the lateral space and avoids the lateral diffusion for the P+ sinker.

Figure 3:
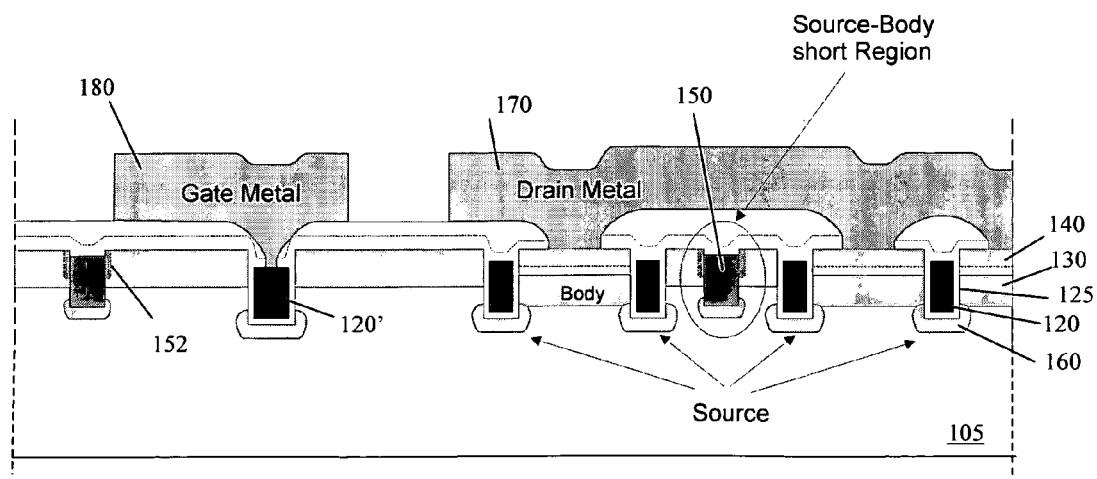
FIG. 3 is a cross sectional view of another inverted ground-source trenched FET device with the bottom source formed on a highly doped N+ bottom layer and using a body-source short structure formed as metal interconnect layers in the device as another embodiment of this invention.

Referring to FIG. 3 for an alternate embodiment of an inverted ground-source trenched FET device that has a similar configuration as that shown in FIG. 2. The only difference is the device is formed on a N+ substrate with a N− Epi layer over the substrate. The body layer 130 is formed with ion implantation. The body-source short structure has an optional P+ dope region 152 formed on at least part of the sidewall of the body-source short trench to improve the body contact with the conductive plug 150.

Figure 4:
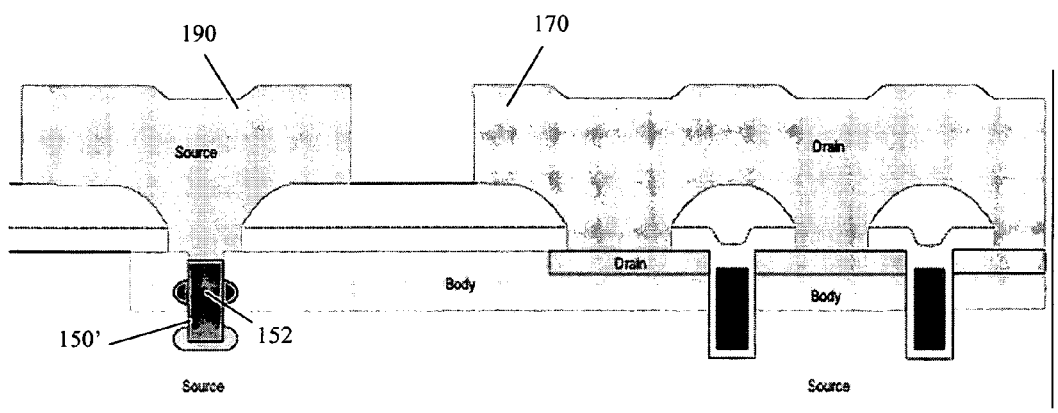
FIG. 4 is a cross sectional view of another inverted ground-source trenched FET device with a trenched source contact for connecting to the bottom source from the top surface.

Referring to FIG. 4 for another iT-FET device as an alternate embodiment of this invention. The device in FIG. 4 has a same structure as FIG. 3 except that there is a trench body-source short plug connection 150 in the termination region connects the buried source 105 disposed on the bottom of the substrate to a source pad 190 disposed at the top surface of semiconductor. Alternatively this body-source short plug and source pad 190 may be form at the same time depositing the drain metal 170 using the same material.

As that shown in FIGS. 2 and 3, the trench in the termination area is filled with the gate polysilicon layer 120' to function as gate runner as part of the continuous extension of the trenched gate 120 disposed on the active cell area. The gate metal 180 is formed the same time as the drain metal 170 is formed then patterned into the drain metal and the gate metal on the top surface of the device with the source electrode formed at the bottom of the substrate serving as a ground electrode.

According to above device configuration, a low manufacturing cost is achieved because a lower effective die cost can be achieved by using a small die and this reduced cost is able to offset the higher manufacturing costs. Most importantly, a low source inductance is achieved through the use of a substrate source contact while minimizing the source resistance by implementing the source-body short structure distributed over the device. Furthermore, a small pitch of the device as described above further reduces the specific-on-resistance (Rsp) for a given operating voltage. The device configuration is conveniently scalable for compatible designs and operations adaptable to devices that require a range of high and low voltages. The device further provides rugged and reliable performance with reduced possibility of latch up, reduced hot carrier injection, and capability to handle peak generation away from gate oxide, etc., because of the distributed body contact through the source-body short structure. Therefore, an inverted ground-source trenched FET device is disclosed that allows for vertical current through vertical channel. The controllable drift length of the drift region implemented with the vertical channel enable the manufactures of small and scalable cell pitch. With the source contact at the bottom of the trench in direct contact with the highly doped substrate reduces the source resistance. There is no longer a need for deep resistive sinker region or trench contact as that usually implemented in the conventional bottom source FET devices.

Figure 5A:
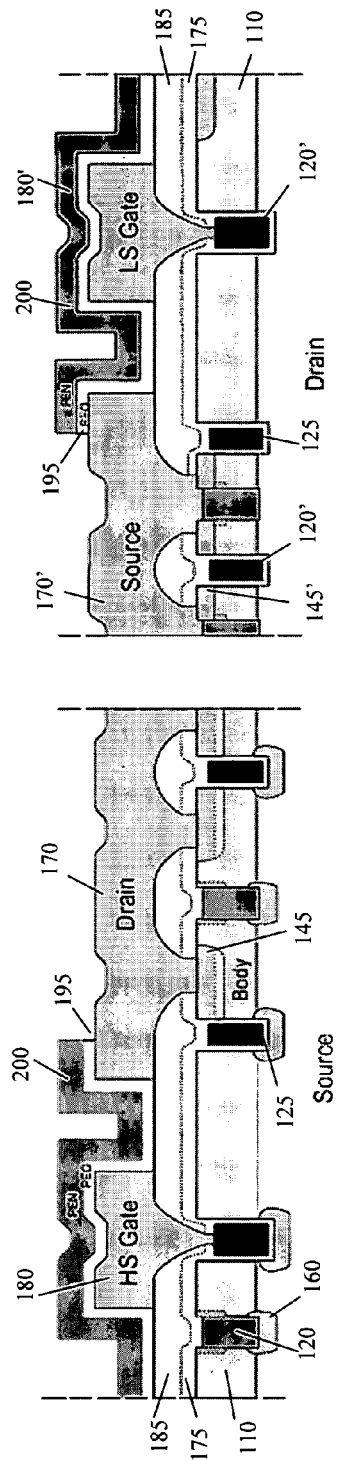
FIGS. 5A and 5B are the cross sectional view and a circuit diagram respectively of an integrated and combined buck converter of this invention with the iT-FET device function as the top FET device and a Schottky FET device function as the bottom device.
Figure 5B:
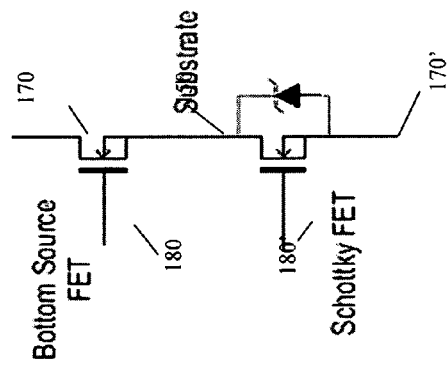

FIG. 5A is a cross sectional view of an integrated high-side and low-side trenched power MOSFET for a buck converter and FIG. 5B shows the circuit diagram of the buck converter. The buck converter shown in FIGS. 5A and 5B integrates the iT-FET device as shown in FIG. 2 with a Schottky metal oxide semiconductor (MOS) device disclosed in application Ser. Nos. 11/056,346 and 11/356,944. The disclosures made in these two Applications are hereby incorporated by reference in this Application. Any other Schottky diodes can be integrated with a planar or trenched FET or iT-FET for buck converter application. The iT-FET device and the Schottky FET are supported on a common substrate 105 that functions as a source for the iT-FET device and a drain for the Schottky FET device. The Schottky FET device includes a trenched gate 120' surrounded by the source regions 145' near the top surface encompassed in a body region 110. The source regions 145' are in electrical contact with a source metal layer 170'. The trenched gates 120' of the Schottky FET device are padded by a gate oxide layer 125' and are electrically connected to a gate metal 180'. Instead of assembling a buck converter on the board level or on package level with complex leadframe, this invention integrates the HS and LS MOSFET for a buck converter on one semiconductor die therefore reduce package size. The cost of package is also reduced due to the use of simpler leadframe structure.

Figure 6A:
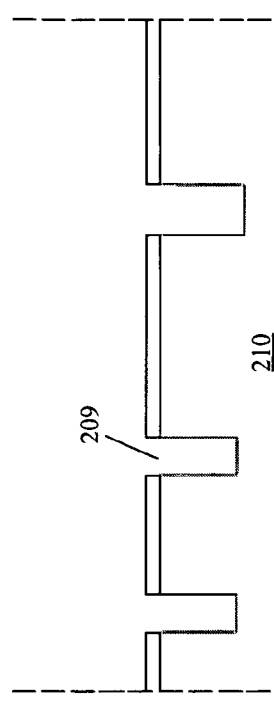
Figure 6A:
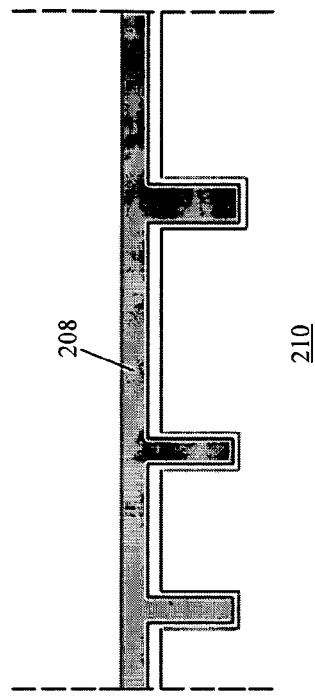
Figure 6B:
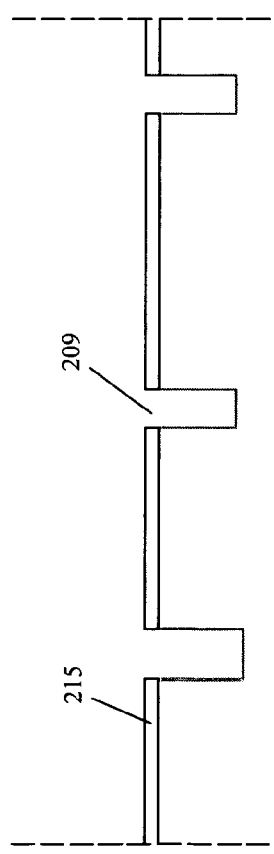
Figure 6B:
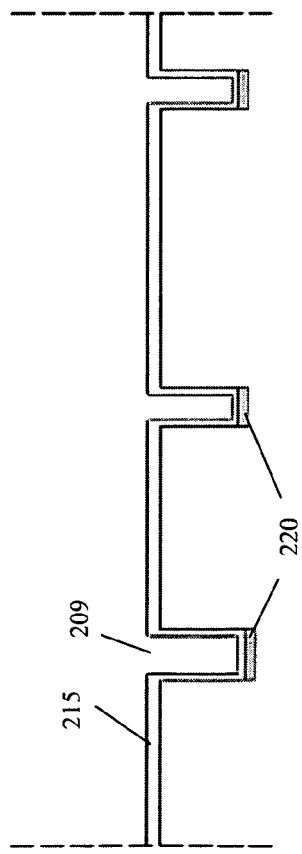

Referring to FIGS. 6A to 6K for serial of side cross sectional views to illustrate the manufacturing processes for making a device structure as shown in FIG. 5A. In FIG. 6A, a LTO (Low Temperature Oxide) deposition is performed to form an oxide layer 215 following by applying a trench mask (not shown). Then an oxide etch and trench etch are performed to form a plurality of trenches 209 in an epitaxial layer 210 supported on a substrate 205 then the mask is removed. Then the semiconductor die is processed with two areas, a high-side iT-FET area and a low-side FET area. In FIG. 6B, a sacrificial oxidation is first performed to form a sacrificial oxide layer followed by applying a bottom source photo resist mask 208 to carry out a zero degree trench bottom source implant to form a plurality of bottom source region 220 in high-side iT-FET area while the low-side FET area is block by photo resist mask 208. In FIG. 6C, the mask 208 is removed and a sacrificial oxide etch is performed followed by a gate oxidation process to form the gate oxide layer 225 and also diffuse the trench bottom source regions 220. In FIG. 6D, a polysilicon layer is deposited, doped and then etched back. An oxide etch is performed followed by a screen oxidation to form an oxide layer 235.

Figure 6F:
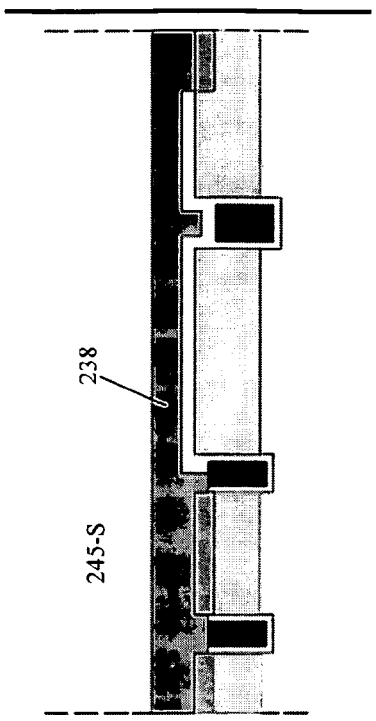
Figure 6F:
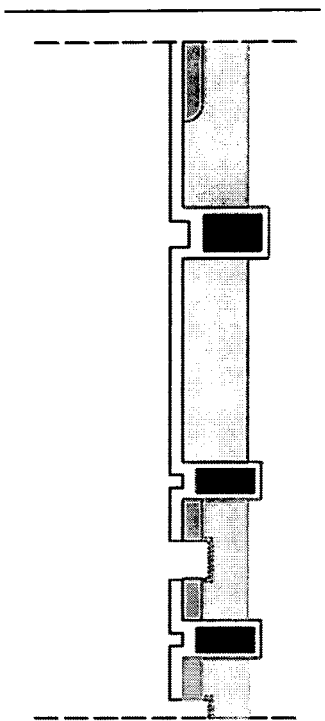
Figure 6G:
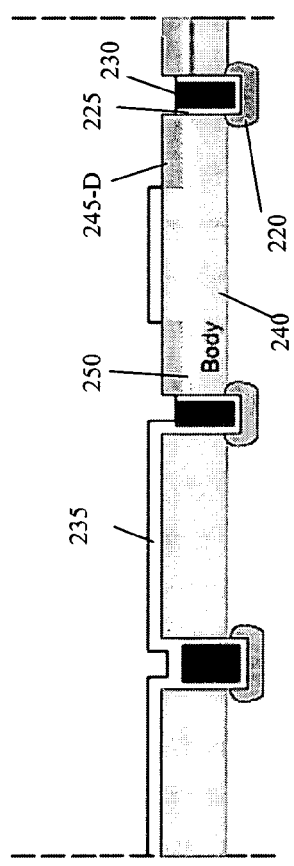
Figure 6G:
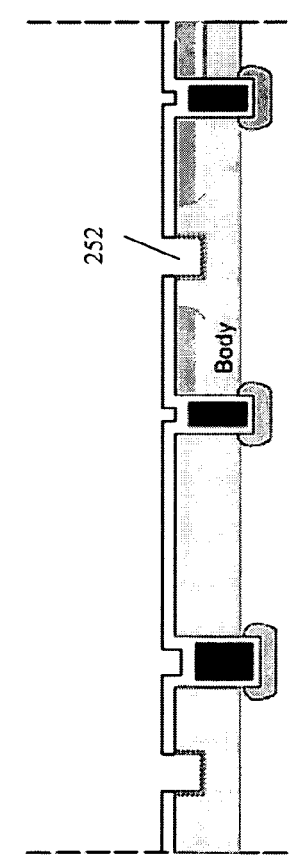

In FIG. 6E, a selective body dopant implant is performed using a body mask to form the body regions 240 followed by a body diffusion process to diffuse the body regions 240 into the epitaxial layer 210. A layer of oxide is also grown at this step. A source/drain photo resist mask 237 is applied to first carry out an oxide etch followed by an N+ dopant implant to form the drain regions 245-D and the source regions 245-S for the iT-FET and the Schottky device respectively. In FIG. 6F, the source/drain mask 237 is removed and a lateral drift diffusion (LDD) mask 238 is applied to implant the LDD regions 250 for the iT-FET device. In FIG. 6G, a contact trench photo resist mask (not shown) is applied to open a plurality of contact trenches 252 by an oxide etch followed by silicon etch and large tilt angle contact implant.

Figure 6J:
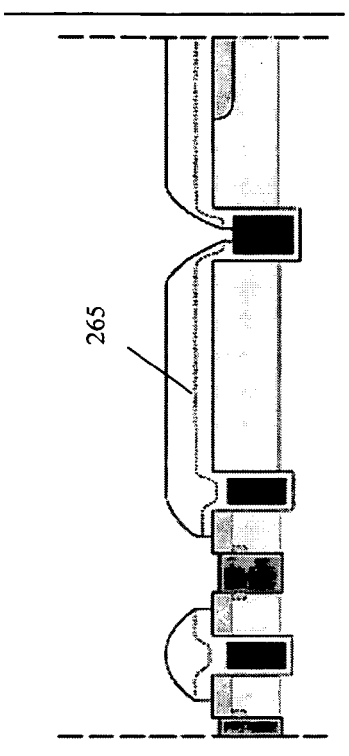
Figure 6J:
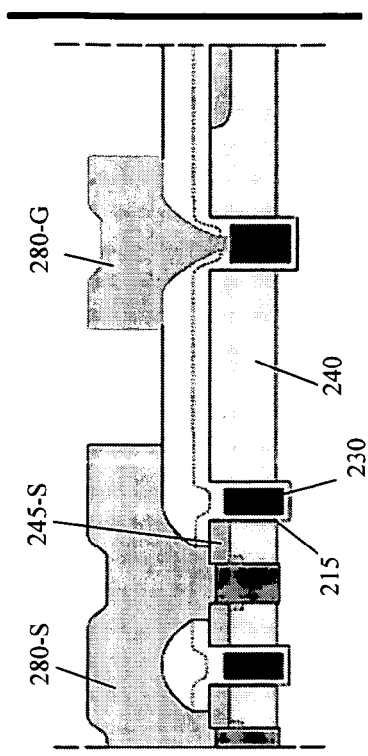
Figure 6K:
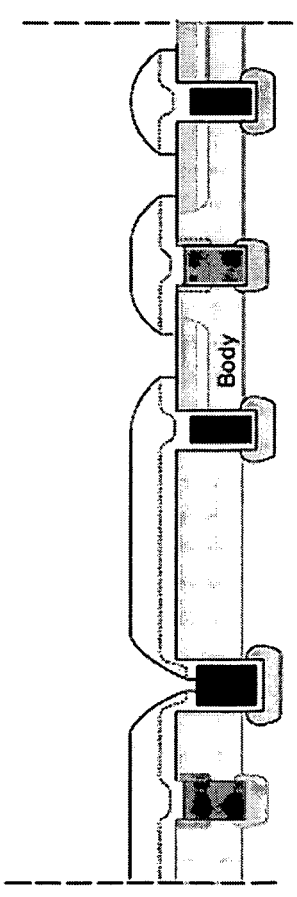
Figure 6K:
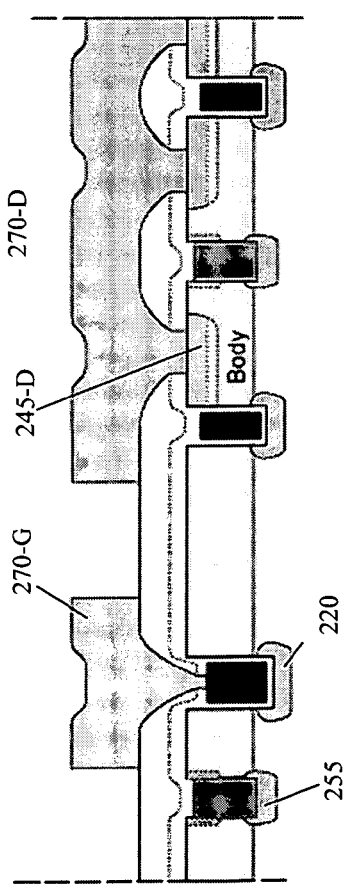

In FIG. 6H, a silicon etch is carried out to further etch the contact trenches and a bottom contact trench photo resist mask 239 is applied to implant the trench bottom contact regions 255 for the iT-FET device for contacting the bottom source regions. In FIG. 6I, the photo resist mask 239 is removed followed by an annealing process then a silicide deposition of tungsten 260, or other types of metals such as titanium or cobalt, is performed and etched back. A plurality of bottom source contact plug 260 is formed in the iT-FET device and trenched Schottky diodes 260-S are formed in the Schottky device. In FIG. 6J, a LTO deposition process is performed to form the top oxide layer 265 followed by a. BPSG layer deposition and reflow. A contact mask (not shown) is applied to open a plurality of contact openings for contacting the the gate and the drain 245-D of the iT-FET and the gate and the source 245-S in the low-side MOSFET with Schottky device that includes the trenched Schottky diodes 260-S. In FIG. 6K, a metal layer is deposited and then patterned into gate metal 270-G and drain metal 270-D for the iT-FET device with the source terminal formed on the bottom. The metal layer is further patterned into the gate metal 280G and source metal 280-S for the low-side MOSFET with Schottky device.

Although the present invention has been described in terms of the presently preferred embodiment, it is to be understood that such disclosure is not to be interpreted as limiting. Various alterations and modifications will no doubt become apparent to those skilled in the art after reading the above disclosure. Accordingly, it is intended that the appended claims be interpreted as covering all alterations and modifications as fall within the true spirit and scope of the invention.

We claim:

1. An inverted field-effect-transistor (iT-FET) semiconductor device comprising a source disposed on a bottom and a drain disposed on a top of a semiconductor substrate further comprises:
    a vertical current conducting channel between said source and said drain disposed along a trenched gate padded by a gate oxide disposed on sidewalls of a trench opened in said semiconductor substrate;
    a trenched source-body short structure comprises a conductive plug filled in a source-body contact trench wherein said conductive plug extending downwardly in said source-body contact trench from a top surface to a bottom surface of the source-body contact trench above the source disposed at the bottom of said semiconductor substrate with a body dopant region surrounding a bottom portion of said source-body contact trench for electrically shorting a body region surrounding said trenched gate in said substrate to said source disposed on said bottom of said substrate; and
    said conductive plug in said body-source short structure further comprising a conductive Titanium silicide extending downwardly in said source-body contact trench from said top surface of said semiconductor substrate to said source region.

2. The iT-FET semiconductor device of claim 1 further comprising:
    a termination region disposed on a peripheral area of said semiconductor substrate and said trenched source-body short structure is disposed in the termination region.

3. The iT-FET semiconductor device of claim 2 further comprising:
    a drift region having a same conductivity type as said source region disposed near said top surface of said substrate surrounding an upper portion of said trenched gate and encompassing said drain; and
    a link region having the same conductivity type as said source region disposed below said drift region and extending downwardly to said body region for linking said drift region and said body region for providing a source to body current channel.

4. The iT-FET semiconductor device of claim 3 wherein comprising:
    said drift region is a N-drift region and is left unconnected for constituting a floating N-drift region and having substantially a source voltage whereby a die-sawing damage to said iT-FET device caused by grounding said N-drift region is reduced.

5. The iT-FET semiconductor device of claim 3 wherein comprising:
    said body region is formed in an N-epitaxial layer in said semiconductor substrate as an implanted body region.

6. The iT-FET semiconductor device of claim 3 wherein comprising:
    said source-body short structure constituting a conductive plug extending downwardly from a bottom surface of a buried conductor trench disposed in a termination area for on said semiconductor substrate for electrically shorting a body region in said substrate to said source disposed on said bottom of said substrate and further for shorting said source disposed on said bottom of said substrate to a source pad disposed on a top surface of said semiconductor substrate.

7. The iT-FET semiconductor device of claim 1 further comprising:
    a region having a same conductivity type as said source region disposed below a bottom surface of said trenched gate functioning as a top portion of said source region surrounded by said body region doped with a body dopant having an opposite conductivity type than said source region.

8. The iT-FET semiconductor device of claim 1 wherein:
    said trenched gate further comprising a thick spacer-oxide layer disposed on an upper portion of said sidewalls for insulating said trenched gate from said drain disposed near a top surface of said semiconductor substrate to further reduce a gate-drain coupling capacitance.

9. The iT-FET semiconductor device of claim 1 wherein:
    said source further comprising a N+ doped substrate layer disposed on said bottom of said substrate.

10. The iT-FET semiconductor device of claim 9 wherein:
    said drain further comprising a N+ doped region disposed immediately below a drain metal layer covering said top surface of said semiconductor substrate.

11. The iT-FET semiconductor device of claim 9 wherein:
    said body region comprising a P doped region disposed in said substrate and surrounding a bottom portion of said trenched gate extending downwardly to said source.

12. The iT-FET semiconductor device of claim 9 wherein:
    said bottom of said semiconductor substrate further comprising a N+ doped layer to function as a contact-enhancement layer for enhancing an electrical contact to said source region.

13. The iT-FET semiconductor device of claim 1 further comprising:
    a termination area disposed near a peripheral area of said semiconductor substrate; and
    a trenched gate runner extending from a central portion of said semiconductor to the peripheral area of said semiconductor substrate for electrically connecting a termination trenched gate to said trenched gate for electrically connecting the termination trenched gate to a gate metal disposed on top of said termination trenched gate in said termination area.

14. The iT-FET semiconductor device of claim 1 wherein:
    said iT-FET comprises a bottom source metal oxide semiconductor field effect transistor (MOSFET) device.

15. An inverted field-effect-transistor (iT-FET) semiconductor device comprising a source disposed on a bottom and a drain disposed on a top of a semiconductor substrate further comprises:

a vertical current conducting channel between said source and said drain disposed along a trenched gate padded by a gate oxide disposed on sidewalls of a trench opened in said semiconductor substrate;

a trenched source-body short structure comprises a conductive plug filled in a source-body contact trench wherein said conductive plug extending downwardly in said source-body contact trench from a top surface to a bottom surface of the source-body contact trench above the source disposed at the bottom of said semiconductor substrate with a body dopant region surrounding a bottom portion of said source-body contact trench for electrically shorting a body region surrounding said trenched gate in said substrate to said source disposed on said bottom of said substrate; and said conductive plug in said body-source short structure further comprising a conductive Cobalt silicide extending downwardly in said source-body contact trench from said top surface of said semiconductor substrate to said source region.

16. An inverted field-effect-transistor (iT-FET) semiconductor device comprising a source disposed on a bottom and a drain disposed on a top of a semiconductor substrate further comprises:

a vertical current conducting channel between said source and said drain disposed along a trenched gate padded by a gate oxide disposed on sidewalls of a trench opened in said semiconductor substrate;

a trenched source-body short structure comprises a conductive plug filled in a source-body contact trench wherein said conductive plug extending downwardly in said source-body contact trench from a top surface to a bottom surface of the source-body contact trench above the source disposed at the bottom of said semiconductor substrate with a body dopant region surrounding a bottom portion of said source-body contact trench for electrically shorting a body region surrounding said trenched gate in said substrate to said source disposed on said bottom of said substrate; and said conductive plug in said body-source short structure further comprising a conductive Tungsten silicide extending downwardly in said source-body contact trench from said top surface of said semiconductor substrate to said source region.

* * * * *